(12) United States Patent
Murakami et al.

(10) Patent No.: US 10,312,078 B2
(45) Date of Patent: Jun. 4, 2019

(54) NITRIDE FILM FORMING METHOD AND STORAGE MEDIUM

(71) Applicant: TOKYO ELECTRON LIMITED, Tokyo (JP)

(72) Inventors: Hiroki Murakami, Nirasaki (JP); Daisuke Suzuki, Nirasaki (JP); Takahiro Miyahara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 66 days.

(21) Appl. No.: 15/466,264

(22) Filed: Mar. 22, 2017

(65) Prior Publication Data
US 2017/0278705 A1 Sep. 28, 2017

(30) Foreign Application Priority Data
Mar. 23, 2016 (JP) .................................. 2016-057911

(51) Int. Cl.
| | |
|---|---|
| *H01L 21/02* | (2006.01) |
| *C23C 16/34* | (2006.01) |
| *C23C 16/455* | (2006.01) |
| *C23C 16/46* | (2006.01) |

(Continued)

(52) U.S. Cl.
CPC ........ *H01L 21/02312* (2013.01); *C23C 16/02* (2013.01); *C23C 16/04* (2013.01); *C23C 16/345* (2013.01); *C23C 16/45525* (2013.01); *C23C 16/45544* (2013.01); *C23C 16/46* (2013.01); *H01L 21/0217* (2013.01); *H01L 21/0228* (2013.01); *H01L 21/02211* (2013.01); *H01L 21/02271* (2013.01)

(58) Field of Classification Search
CPC ......... H01L 21/02312; H01L 21/02211; H01L 21/02271; H01L 21/76897; H01L 21/0217; H01L 21/0228; C23C 16/45544; C23C 16/04; C23C 16/02; C23C 16/345; C23C 16/45525; C23C 16/46
See application file for complete search history.

(56) References Cited

U.S. PATENT DOCUMENTS

| | | | | |
|---|---|---|---|---|
| 5,178,682 A | * | 1/1993 | Tsukamoto | ....... H01L 21/02043 118/722 |
| 7,504,681 B2 | * | 3/2009 | Lim | .................. H01L 27/14621 257/291 |

(Continued)

FOREIGN PATENT DOCUMENTS

| | | |
|---|---|---|
| JP | 2000-174007 A | 6/2000 |
| JP | 2004-281853 A | 10/2004 |

*Primary Examiner* — Michael M Trinh
(74) *Attorney, Agent, or Firm* — Nath, Goldberg & Meyer; Jerald L. Meyer

(57) ABSTRACT

There is provided a nitride film forming method which includes: performing a pretreatment in which a chlorine-containing gas is supplied while heating a substrate to be processed having a first base film and a second base film formed on the substrate to a predetermined temperature, and is adsorbed onto a surface of the first base film and a surface of the second base film; and forming a nitride film on the first base film and the second base film subjected to the pretreatment, by an ALD method or a CVD method, using a raw material gas and a nitriding gas, while heating the substrate to be processed to a predetermined temperature.

11 Claims, 10 Drawing Sheets

(51) Int. Cl.
*C23C 16/02* (2006.01)
*C23C 16/04* (2006.01)

(56) References Cited

U.S. PATENT DOCUMENTS

2014/0051263 A1* 2/2014 Tanaka .................. C23C 16/345
  438/778
2014/0199854 A1* 7/2014 Chen ................. H01L 21/02312
  438/775
2016/0013042 A1* 1/2016 Hashimoto ............. C23C 16/30
  438/778

* cited by examiner

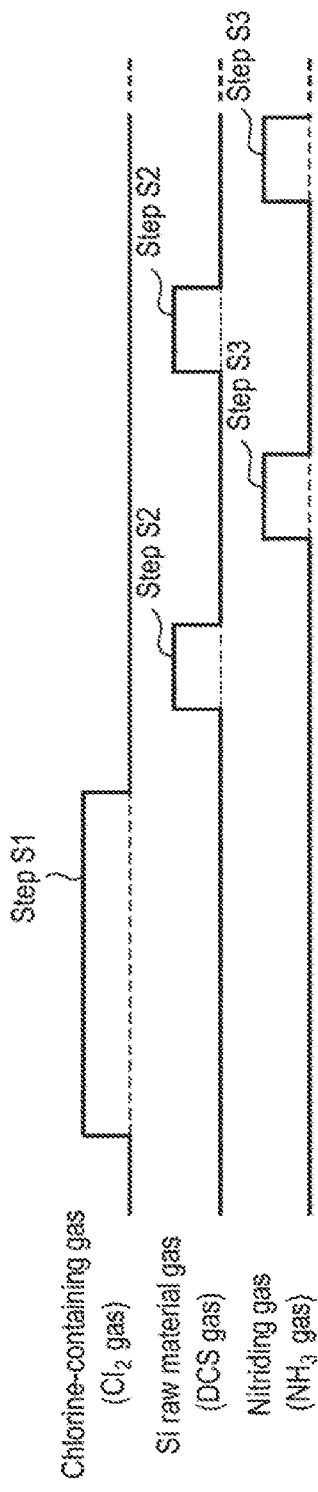

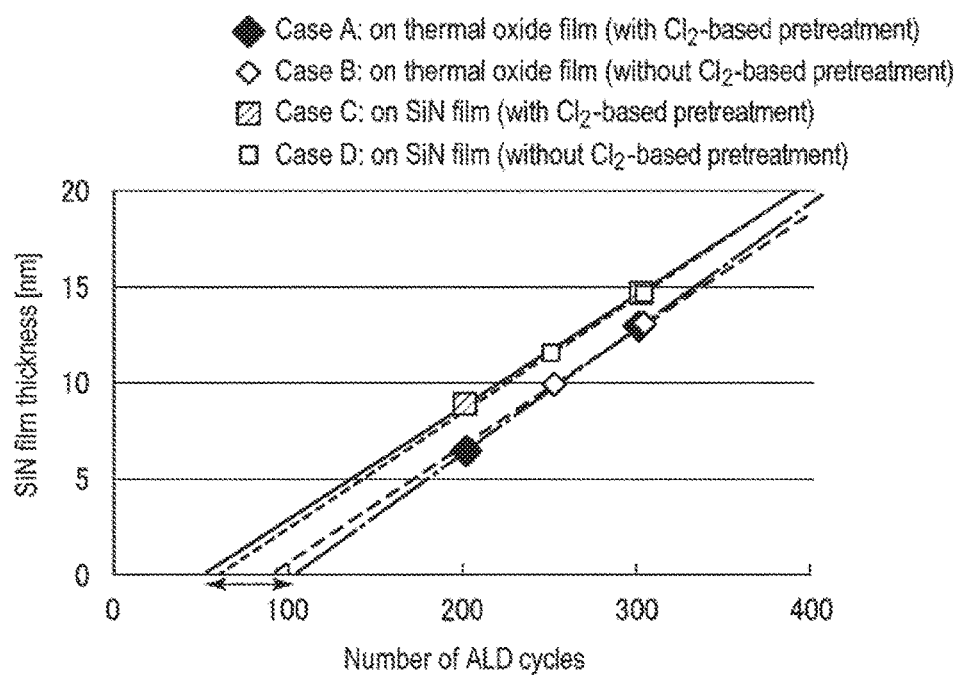

NITRIDE FILM FORMING METHOD AND STORAGE MEDIUM

CROSS-REFERENCE TO RELATED APPLICATION

This application claims the benefit of Japanese Patent Application No. 2016-057911, filed on Mar. 23, 2016, in the Japan Patent Office, the disclosure of which is incorporated herein in its entirety by reference.

TECHNICAL FIELD

The present disclosure relates to a method of forming a nitride film such as a silicon nitride film or the like, and a non-transitory computer-readable storage medium.

BACKGROUND

In a semiconductor device manufacturing sequence, there is a film forming process for forming a nitride film such as a silicon nitride film (SiN film) or the like as an insulating film on a semiconductor wafer represented by a silicon wafer. A chemical vapor deposition (CVD) method is widely used for such a SiN film forming process.

On the other hand, in recent years, along with the advancement of miniaturization and high integration of semiconductor devices, to improve characteristics, a SiN film is formed by sequentially supplying gases as in an atomic layer deposition (ALD) method capable of forming a good quality film at a lower temperature than that of the film formation by the conventional CVD method. In the case of forming the SiN film by the ALD method, for example, a SiN film having a predetermined film thickness is formed by causing a Si raw material to be adsorbed onto a substrate to be processed, subsequently supplying a nitriding gas so as to react with the Si raw material, forming SiN at an atomic layer or molecular layer level, and repeating the above steps a predetermined number of times.

As a method of forming a SiN film by an ALD method, there has been proposed a technique in which a dichlorosilane (DCS: $SiH_2Cl_2$) gas, which is a type of Si raw material gas, and an ammonia ($NH_3$) gas, which is a type of nitriding gas, are alternately supplied, and when supplying the $NH_3$, high frequency power is applied so as to generate plasma to promote a nitriding reaction.

Since the apparatus configuration becomes complicated in the case of using plasma, it has been studied to form, as in a thermal ALD method or the like, a SiN film by a plasma-less sequential gas supply.

By the way, when a nitride film such as a SiN film or the like is grown by an ALD method or a CVD method on a structure in which two or more different base films are exposed, it is required to selectively grow a nitride film only on a specific base film.

SUMMARY

Some embodiments of the present disclosure provide a method capable of selectively forming a nitride film depending on a base film, and a non-transitory computer-readable storage medium.

According to one embodiment of the present disclosure, there is provided a nitride film forming method which includes: performing a pretreatment in which a chlorine-containing gas is supplied while heating a substrate to be processed having a first base film and a second base film formed on the substrate to a predetermined temperature, and is adsorbed onto a surface of the first base film and a surface of the second base film; and forming a nitride film on the first base film and the second base film subjected to the pretreatment, by an ALD method or a CVD method, using a raw material gas and a nitriding gas, while heating the substrate to be processed to a predetermined temperature.

According to another embodiment of the present disclosure, there is provided a non-transitory computer-readable storage medium storing a program operated on a computer and configured to control a processing apparatus, wherein the program is configured to, when executed, cause the computer to control the processing apparatus so that the aforementioned method is performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a view showing one example of a gas supply sequence when steps S2 and S3 are continuously performed by the same apparatus.

FIG. 8 is a view showing a change in incubation cycle (incubation time) during SiN film formation depending on the presence or absence of a $Cl_2$ gas-based pretreatment in experimental examples using a thermal oxide film and a SiN film as base films.

DETAILED DESCRIPTION

Figure 1:
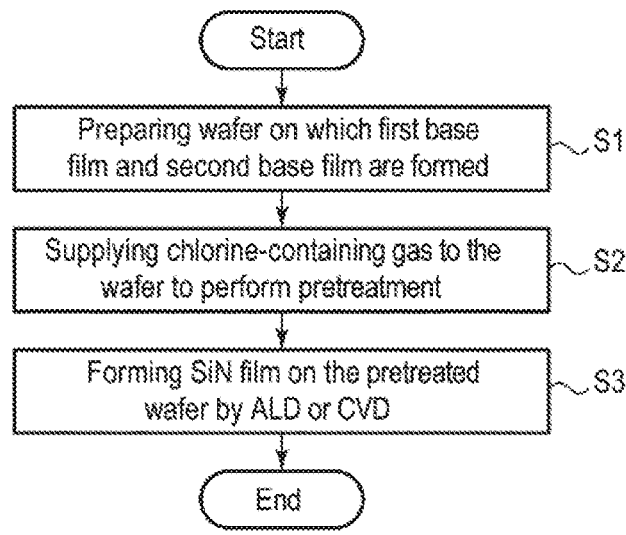
FIG. 1 is a flowchart showing one example of a nitride film forming method according to the present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

History of the Present Disclosure

In general, when a SiN film is formed by a thermal ALD method or a CVD method, a substrate to be processed is accommodated in a process container. A DCS gas as a Si raw material gas and a $NH_3$ gas as a nitriding gas are sequentially supplied a predetermined number of times or simultaneously supplied in a state in which the substrate to be processed is heated to a predetermined temperature. As a result, a SiN film having a predetermined film thickness is formed on the surface of the substrate to be processed.

In the case of forming a SiN film by the ALD method or the CVD method, especially in the case of forming a SiN film by the thermal ALD method, the initial incubation time at the time of forming the SiN film varies depending on a base film. Thus, the timing at which film formation is started is changed somewhat. Therefore, a film thickness difference due to the base film is generated just as much as the difference in the incubation time of the base film.

For example, when the base film is a SiN film and a thermal oxide film ($SiO_2$ film), the incubation time at the time of forming a SiN film is shorter in the SiN film than in the thermal oxide film. Thus, a difference in film growth occurs just as much as the difference in the incubation time.

However, according to the difference in incubation time depending on the inherent properties of such a base film, the film thickness difference is insufficient. In order to effectively cause a selective growth of the SiN film, it is required to enlarge the film thickness difference depending on the base film.

As a result of further study, it was found that in the case of forming a nitride film on two or more types of base films, by subjecting the base films to a pretreatment with a chlorine-containing gas, it is possible to enlarge the incubation time difference depending on the inherent properties of the base films. Specifically, it was found that when a thermal oxide film ($SiO_2$ film) and a SiN film exist as base films, by performing a pretreatment with a chlorine-containing gas, the incubation time on the thermal oxide film becomes longer and the incubation time on the SiN film is equal to or shorter than the incubation time available before the pretreatment. As a result, the incubation time difference can be enlarged. The present disclosure has been completed based on such findings.

<Nitride Film Forming Method>

Next, a nitride film forming method according to an embodiment of the present disclosure will be described. In the present embodiment, a case where a silicon nitride film (SiN film) is formed as a nitride film will be described as an example.

FIG. 1 is a flowchart showing one example of a nitride film forming method according to the present embodiment.

Figure 2:
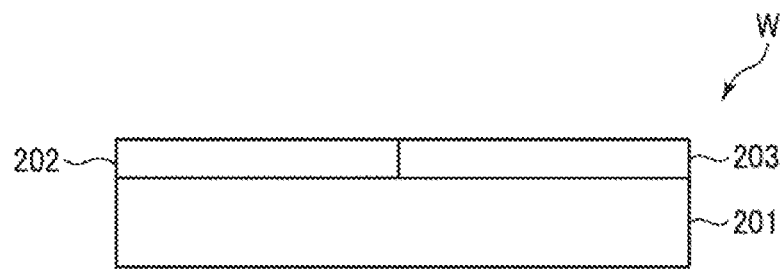
FIG. 2 is a view schematically showing one example of a substrate to be processed used when carrying out the nitride film forming method according to the present embodiment.

First, as a substrate to be processed, a semiconductor wafer (hereinafter simply referred to as a wafer) W having a first base film 202 and a second base film 203 formed on a semiconductor substrate 201 as schematically shown in FIG. 2 is prepared (step S1).

Both the first base film 202 and the second base film 203 are resistant to a chlorine-containing gas and are made of oxide, nitride, carbonitride or the like. In the case of a single metal, there is a possibility that a film is etched by a chlorine-containing gas. The first base film 202 and the second base film 203 may be materials having different incubation times when forming a SiN film. For example, one of the first base film 202 and the second base film 203 may be a thermal oxide film ($SiO_2$ film) and the other may be a SiN film.

Next, a pretreatment with a chlorine-containing gas is performed on the wafer W on which the base films 202 and 203 are formed (step S2). The pretreatment with the chlorine-containing gas in step S2 is a treatment for causing the chlorine-containing gas to be adsorbed onto the first and second base films 202 and 203.

Next, a SiN film is formed on the pretreated wafer W by the ALD method or the CVD method using a Si raw material gas, for example, a DCS gas, and a nitriding gas, for example, a $NH_3$ gas (step S3).

In the pretreatment of step S2, the adsorptivity (reactivity) of the chlorine-containing gas varies depending on the base film. The chlorine-containing gas has an action of inhibiting the adsorption of the Si raw material gas used for forming a subsequent SiN film. Therefore, it is difficult for the SiN film to be formed on the base having good adsorptivity of the chlorine-containing gas. This makes it possible to prolong the incubation time. Thus, it is possible to generate a difference in the film thickness of the SiN film depending on the base film and to selectively form a film depending on the base film.

Figure 3:
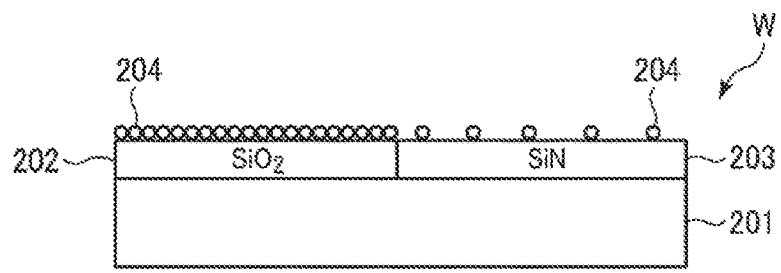
FIG. 3 is a view schematically showing a state in which a chlorine-containing gas is absorbed onto the substrate to be processed shown in FIG. 2.

Specifically, when the first base film 202 is a thermal oxide film ($SiO_2$ film) and the second base film 203 is a SiN film, if a pretreatment is performed with a chlorine-containing gas, for example, a $Cl_2$ gas, as shown in FIG. 3, a larger amount of $Cl_2$ gas 204 is adsorbed onto the first base film 202 because the $Cl_2$ gas has high reactivity with the $SiO_2$ film. However, a smaller amount of $Cl_2$ gas 204 is adsorbed onto the second base film 203 because the reactivity of the $Cl_2$ gas with the SiN film is low.

On the other hand, when the base film is a thermal oxide film ($SiO_2$ film), the incubation time at the time of forming the SiN film is usually long. Since the effect of inhibiting adsorption of the Si raw material gas is enhanced due to the increased adsorption amount of the $Cl_2$ gas, the incubation time grows longer. In contrast, when the base film is a SiN film, the incubation time is usually shorter than that of the $SiO_2$ film. Since the adsorption amount of the $Cl_2$ gas is small, the incubation time is equal to or even shorter than the incubation time available before the pretreatment.

Figure 4:
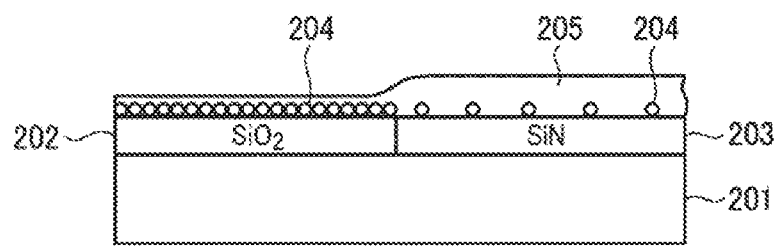
FIG. 4 is a view schematically showing a state in which a SiN film is formed on the substrate to be processed onto which the chlorine-containing gas is absorbed as shown in FIG. 3.

Thus, the difference in the incubation time between the first base film 202 and the second base film 203 is enlarged. As shown in FIG. 4, the film thickness of the SiN film 205 formed on the second base film 203 can be made sufficiently larger than the film thickness of the SiN film 205 formed on the first base film 202. That is to say, the SiN film can be selectively formed depending on the respective base film.

The temperature in step S2 may be a temperature at which the chlorine-containing gas can be adsorbed, and may be in a range of 200 to 800 degrees C. The pressure in step S2 may be in a range of 0.1 to 100 Torr (13.3 to 13,330 Pa). The process time in step S2 may preferably be 60 to 1,800 sec. Examples of the chlorine-containing gas that can be used in step S2 may include a HCl gas, a $BCl_3$ gas and the like, in addition to the $Cl_2$ gas. Among these gases, the $Cl_2$ gas having high reactivity is preferred.

As described above, the formation of the SiN film in step S3 may be performed by either the ALD method or the CVD method. However, the ALD method may be used in order to sufficiently obtain the effect of inhibiting the adsorption of the Si raw material gas by the chlorine-containing gas adsorbed onto the base film in step S2. That is to say, in the case of forming the SiN film by the ALD method, the Si raw material gas and the nitriding gas are alternately and repeatedly supplied. Thus, the Si raw material gas can be adsorbed onto the base film onto which the chlorine-containing gas is adsorbed. This makes it easy to obtain the effect of inhibiting the adsorption of the Si raw material gas by the chlorine-containing gas. In the case of the CVD method, the Si raw material gas and the nitriding gas are supplied at the same time. Thus, the effect provided by the chlorine-containing gas is somewhat reduced due to the reaction between the chlorine-containing gas and the nitriding gas. From the same viewpoint, in the case of the ALD method, the Si raw material may be supplied at first.

In the case where the formation of the SiN film in step S3 is performed by the ALD method, the step of supplying the Si raw material gas and the step of supplying the nitriding gas are repeated. After each step, a process of removing an excess gas used in each step from the wafer W, for example, purging is performed. Such process of removing an excess gas may be performed using an inert gas such as a $N_2$ gas or an Ar gas, and when such process would be carried out may appropriately be set by a film forming apparatus to be described later.

The film formation temperature in step S3 may be 400 to 700 degrees C., specifically 600 to 650 degrees C. The pressure during the process may be 0.1 to 5 Torr (13.3 to 667 Pa). In the case of the ALD method, when a nitriding gas is supplied, the nitriding gas may be turned into plasma to promote a nitriding reaction. The film formation temperature in this case may be in a range of 450 to 630 degrees C.

Further, in the case where the formation of the SiN film in step S3 is performed by the CVD method, the film formation temperature may be 600 to 800 degrees C., specifically 700 to 780 degrees C. The pressure during the process may be 0.1 to 5 Torr (13.3 to 667 Pa).

As the Si raw material used in the formation of the SiN film, in addition to the DCS described above, it may be possible to use a chlorine-containing silane compound such as monochlorosilane (MCS; $SiClH_3$), trichlorosilane (TCS; $SiHCl_3$), silicon tetrachloride (STC; $SiCl_4$), hexachlorodisilane (HCD; $Si_2Cl_6$), or the like, a silane compound such as monosilane ($SiH_4$), disilane ($Si_2H_6$) or the like, and an organic silane-based compound such as aminosilane-based compound or the like.

As the nitriding gas used for forming the SiN film, in addition to the $NH_3$ gas described above, it may be possible to use a hydrazine ($N_2H_4$) gas or a derivative thereof such as, e.g., a monomethyl hydrazine (MMH) gas or the like.

It is preferable that step S2 of causing the chlorine-containing gas to be adsorbed and step S3 of forming the SiN film may be continuously performed in-situ by the same apparatus. This makes it possible to perform these processes with a high throughput maintaining the vacuum atmosphere. In this case, step S2 and step S3 may be performed at the same temperature which falls within a range of 400 to 700 degrees C. An example of the gas supply sequence when step S2 and step S3 are continuously performed by the same apparatus in this manner is as shown in FIG. 5. That is to say, the wafer W as shown in FIG. 2 is set in a process container of an appropriate processing apparatus, the chlorine-containing gas is supplied first and the pretreatment corresponding to step S2 is performed for an appropriate time (step S1). Then, the supply of a Si raw material gas (step S2) and the supply of a nitriding gas (step S3) are repeated a predetermined number of times. After each step, as described above, a process of removing an excess gas used in each step from the water W, for example, purging is performed.

APPLICATION EXAMPLE

Next, an application example of a selective film formation according to the present embodiment will be described.

Figure 6A:
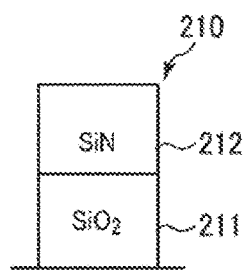
FIGS. 6A, 6B and 6C are sectional views schematically showing application examples of the nitride film forming method according to the embodiment of the present disclosure.
Figure 6B:
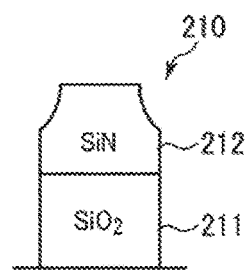
Figure 6C:
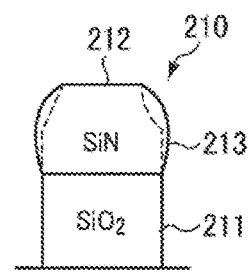

In recent years, along with miniaturization of devices, for example, an etching process margin is getting smaller and an etching error is more likely to occur. For example, when a laminated structure 210 of a $SiO_2$ film 211 and a SiN film 212 shown in FIG. 6A is formed by etching, the SiN film 212 is often etched more excessively than intended as shown in FIG. 6B. In such a case, as shown in FIG. 6C, by selectively forming SiN film 213 on the SiN film 212 according to the selective SiN film forming method of the present embodiment, it is possible to repair the excessive etching with extreme ease.

Figure 7A:
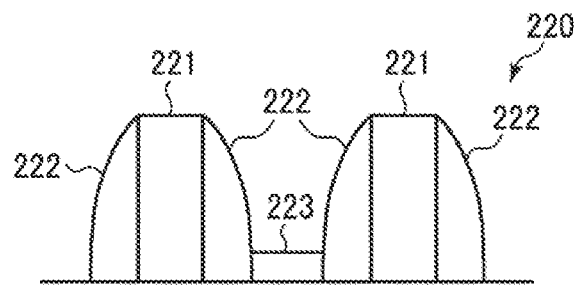
FIGS. 7A, 7B and 7C are sectional views schematically showing examples in which the nitride film forming method according to the embodiment of the present disclosure is applied to actual devices.
Figure 7B:
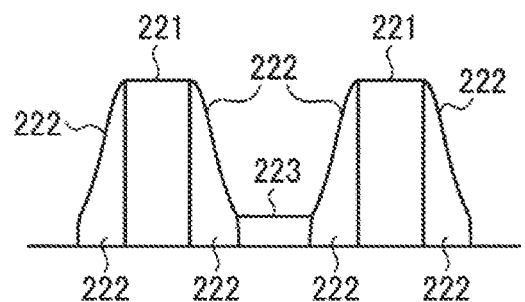
Figure 7C:
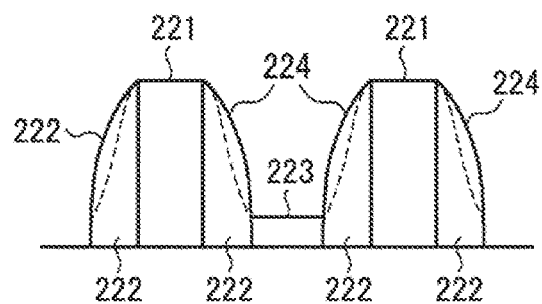

As a specific example, descriptions will be made on a case where a structure part 220, in which a spacer 222 made of a SiN film is formed on a gate electrode 221 (detailed structure thereof omitted) as shown in FIG. 7A, is formed by etching the spacer 222. In FIG. 7A, reference numeral 223 denotes a thermal oxide film. When the spacer 222 is excessively etched, the spacer 222 becomes thinner than planned as shown in FIG. 7B. Thus, the insulating property of the spacer 222 does not satisfy the specifications. In such a case, it would be extremely convenient if the excessively etched spacer 222 can be repaired. Therefore, as shown in FIG. 7C, a selective SiN film 224 is formed on the spacer by the selective SiN film forming method of the present embodiment, thereby repairing the spacer 222. At this time, the thickness of the SiN film to be repaired is small, and almost no SiN film is formed on the thermal oxide film 223. Therefore, after the repair, just as in the ordinary case, the thermal oxide film 223 is merely removed by etching. No additional step other than the selective formation of the SiN film is necessary.

Experimental Example

Next, descriptions will be made on an experimental example which compares the incubation times when a SiN film is formed on a thermal oxide film ($SiO_2$ film) and a SiN film used as base films by the ALD method, in a case where a $Cl_2$ gas-based pretreatment is performed on the surfaces of the base films and a case where the $Cl_2$ gas-based pretreatment is not performed.

The relationship between the number of cycles and the film thickness of the SiN film was found for a case (case A) where a SiN film was formed after performing the $Cl_2$ gas-based pretreatment on a thermal oxide film ($SiO_2$ film), a case (case B) where a SiN film was formed without performing the $Cl_2$ gas-based pretreatment on a thermal oxide film ($SiO_2$ film), a case (case C) where a SiN film was formed after performing the $Cl_2$ gas-based pretreatment on a SiN film, and a case (case D) where a SiN film was formed without performing the $Cl_2$ gas-based pretreatment on a SiN film. The results are shown in FIG. 8.

As shown in FIG. 8, in the conventional case where the $Cl_2$ gas-based pretreatment is not performed, the number of incubation cycles (corresponding to the incubation time) until the start of film formation is about 62 cycles on the SiN film (case D) and was about 89 cycles on the thermal oxide film (case B). In case of the above embodiment in which the $Cl_2$ gas-based pretreatment is performed, the number of incubation cycles was about 52 cycles on the SiN film (case C) and was about 103 cycles on the thermal oxide film (case A).

From the above results, it was confirmed that by performing the $Cl_2$ gas-based pretreatment according to the above embodiment, it is possible to enlarge the incubation time difference when the SiN film is formed on the thermal oxide film and the SiN film as the base films, and to further enhance the selectivity of the SiN film formation.

<Film Forming Apparatus>

Next, an example of a film forming apparatus for carrying out the nitride film forming method according to the present disclosure will be described.

First Example of Film Forming Apparatus

In this example, a vertical batch-type film forming apparatus is shown as an example of the film forming apparatus.

Figure 9:
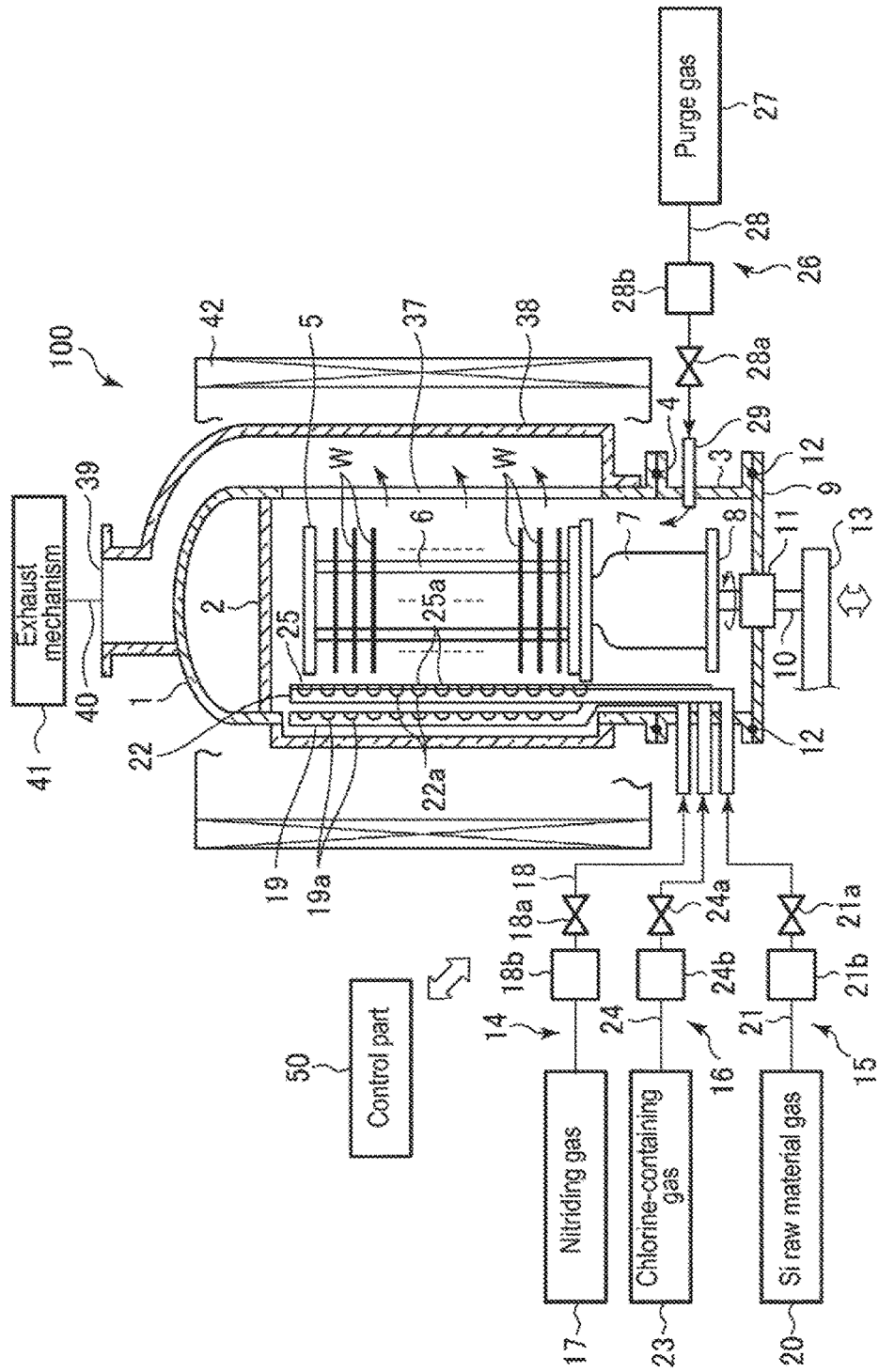
FIG. 9 is a vertical sectional view showing a first example of a film forming apparatus for carrying out the nitride film forming method of the present disclosure.
Figure 10:
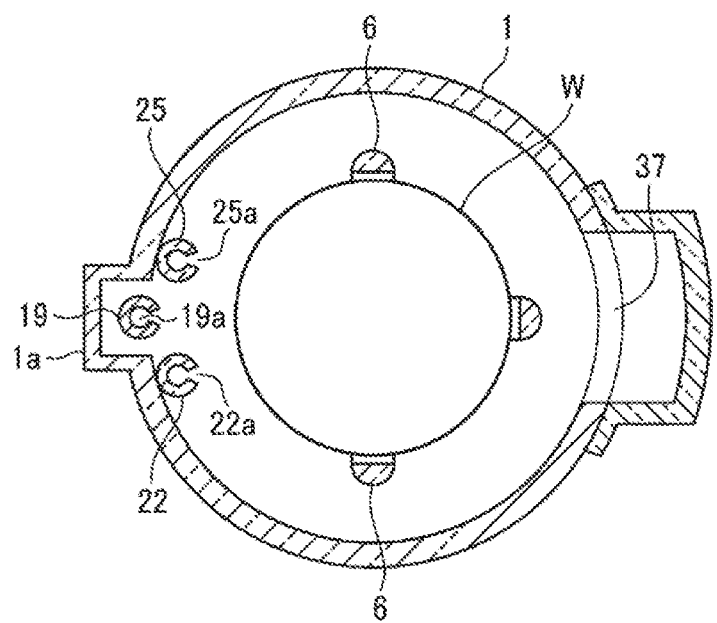
FIG. 10 is a horizontal sectional view of the film forming apparatus shown in FIG. 9.

FIG. 9 is a vertical sectional view showing a first example of the film forming apparatus for carrying out the nitride film forming method according to the present disclosure, and FIG. 10 is a horizontal sectional view showing the film forming apparatus of FIG. 9. In FIG. 10, a heating device is omitted.

The film forming apparatus 100 of this example includes a cylindrical process container 1 having a ceiling with its lower end opened. The entire process container 1 is made of, for example, quartz. The ceiling of the process container 1 is provided with and sealed by a ceiling plate 2 made of quartz. As will be described later, the process container 1 is configured to be heated by the heating device and is configured as a hot wall type film forming apparatus. A manifold 3 formed in a cylindrical shape by, for example, stainless steel is connected to a lower end opening portion of the process container 1 via a seal member 4 such as an O ring or the like.

The manifold 3 supports the lower end of the process container 1. A quartz-made wafer boat 5, on which a plurality of, for example, 50 to 150 semiconductor wafers (hereinafter simply referred to as "wafers") W as workpieces are placed in multiple stages, can be inserted into the process container 1 from below the manifold 3. The wafer boat 5 includes three support columns 6 (see FIG. 10). The plurality of wafers W is supported by grooves formed in the support columns 6.

The wafer boat 5 is placed on a table 8 via a quartz-made heat insulating tube 7. The table 8 is supported on a rotary shaft 10 that penetrates a lid 9 configured to open and close the lower end opening portion of the manifold 3 and made of, for example, stainless steel.

For example, a magnetic fluid seal 11 is installed in the penetration portion of the rotary shaft 10 to rotatably support the rotary shaft 10 while air-tightly sealing the penetration portion. A seal member 12 made of, for example, an O ring is installed between the peripheral portion of the lid 9 and the lower end portion of the manifold 3, thereby keeping the interior of the process container 1 in a sealed state.

The rotary shaft 10 is attached to the tip of an arm 13 supported by an elevating mechanism (not shown such as, e.g., a boat elevator. The water boat 5, the lid 9 and the like are raised and lowered as a unit and are inserted into the process container 1. Alternatively, the table 8 may be fixedly installed in the lid 9 so that the wafers W can be processed without rotating the wafer boat 5.

The film forming apparatus 100 includes a nitriding gas supply mechanism 14 configured to supply a nitriding gas, for example, a $NH_3$ gas into the process container 1, a Si raw material gas supply mechanism 15 configured to supply a Si raw material gas, for example, a DCS gas, into the process container 1, a chlorine-containing gas supply mechanism 16 configured to supply a chlorine-containing gas, for example, a $Cl_2$ gas, into the process container 1. The film forming apparatus 100 further includes a purge gas supply mechanism 26 configured to supply an inert gas as a purge gas, for example, a $N_2$ gas, into the process container 1.

The nitriding gas supply mechanism 14 includes a nitriding gas supply source 17, a nitriding gas pipe 18 configured to guide the nitriding gas from the nitriding gas supply source 17, and a nitriding gas dispersion nozzle 19 connected to the nitriding gas pipe 18. The nitriding gas dispersion nozzle 19 is formed of a quartz tube which penetrates the sidewall of the manifold 3 toward the inside thereof, is bent upward and extends vertically. A plurality of gas discharge holes 19a is formed at a predetermined interval in the vertical portion of the nitriding gas dispersion nozzle 19 so that the nitriding gas can be substantially uniformly discharged from the respective gas discharge holes 19a into the process container 1 in a horizontal direction.

The Si raw material gas supply mechanism 15 includes a Si raw material gas supply source 20, a Si raw material gas pipe 21 configured to guide the Si raw material gas from the Si raw material gas supply source 20, and a Si raw material gas dispersion nozzle 22 connected to the Si raw material gas pipe 21. The Si raw material gas dispersion nozzle 22 is formed of a quartz tube which penetrates the sidewall of the manifold 3 toward the inside thereof, is bent upward and extends vertically. In the Si raw material gas dispersion nozzle 22, a plurality of gas discharge holes 22a is formed at a predetermined interval along the longitudinal direction of the Si raw material gas dispersion nozzle 22 so that the Si raw material gas can be substantially uniformly discharged from the respective gas discharge holes 22a into the process container 1 in a horizontal direction.

The chlorine-containing gas supply mechanism 16 includes a chlorine-containing gas supply source 23, a chlorine-containing gas pipe 24 configured to guide the chlorine-containing gas from the chlorine-containing gas supply source 23, and a chlorine-containing gas dispersion nozzle 25 connected to the chlorine-containing gas pipe 24 and installed so as to penetrate the sidewall of the manifold 3. In the chlorine-containing gas dispersion nozzle 25, a plurality of gas discharge holes 25a is formed at a predetermined interval along the longitudinal direction of the chlorine-containing gas dispersion nozzle 25 so that the chlorine-containing gas can be substantially uniformly discharged from the respective gas discharge holes 25a into the process container 1 in a horizontal direction.

The purge gas supply mechanism 26 includes a purge gas supply source 27, a purge gas pipe 28 configured to guide the purge gas from the purge gas supply source 27, and a purge gas nozzle 29 connected to the purge gas pipe 28 and installed so as to penetrate the sidewall of the manifold 3.

An opening/closing valve 18a and a flow rate controller 18b such as a mass flow controller or the like are installed in the nitriding gas pipe 18 so that the nitriding gas can be supplied while controlling the flow rate thereof. An opening/closing valve 21a and a flow rate controller 21b such as a mass flow controller or the like are installed in the Si raw material gas pipe 21 so that the Si raw material gas can be supplied while controlling the flow rate thereof. An opening/ closing valve 24a and a flow rate controller 24b such as a mass flow controller or the like are installed in the chlorine-containing gas pipe 24 so that the chlorine-containing gas can be supplied while controlling the flow rate thereof. An opening/closing valve 28a and a flow rate controller 28b such as a mass flow controller or the like are installed in the purge gas pipe 28 so that the purge gas can be supplied while controlling the flow rate thereof.

A projecting portion 1a is formed in one side surface of the process container 1 so as to extend along a height direction. As shown in FIG. 10, the nitriding gas dispersion nozzle 19 is disposed in an internal space of the projecting portion 1a. The Si source gas dispersion nozzle 22 and the chlorine-containing gas dispersion nozzle 25 are installed so as to sandwich the nitriding gas dispersion nozzle 19.

In a portion of the process container 1a opposite to the projecting portion 1a, an exhaust port 37 for evacuating the interior of the process container 1 is formed in an elongated shape along the vertical direction of the side wall of the process container 1. An exhaust port cover member 38 formed in a U-like cross-sectional shape so as to cover the exhaust port 37 is attached to the portion of the process container 1 corresponding to the exhaust port 37. The exhaust port cover member 38 extends upward along the sidewall of the process container 1 and defines a gas outlet 39 above the process container 1. An exhaust pipe 40 is connected to the gas outlet 39. An exhaust mechanism 41 including a pressure regulation valve, a vacuum pump and the like is installed in the exhaust pipe 40. The interior of the process container 1 is exhausted by the exhaust mechanism 41, and the interior of the process container 1 is adjusted to a predetermined reduced pressure state.

A tubular heating device 42 for heating the process container 1 and the wafers W existing inside the process container 1 is installed outside of the process container 1 so as to surround the process container 1.

The film forming apparatus 100 includes a control part 50. The control part 50 includes: a main control part provided with a CPU and configured to control respective components of the film forming apparatus 100, for example, the valves, the mass flow controllers as flow rate controllers, the drive mechanisms such as an elevating mechanism and the like, the heater power supply, and the like; an input device such as a keyboard, a mouse or the like; an output device; a display device; and a memory device. By setting a storage medium storing a process recipe in the memory device, the main control part of the control part 50 causes the film forming apparatus 100 to execute a predetermined operation based on the process recipe called out from the storage medium.

Next, the operation when the SiN film is formed by the film forming apparatus 100 configured as above will be described. The following process operation is executed based on the process recipe stored in the storage medium of the memory part of the control part 50.

First, for example, 50 to 150 wafers W, on which two types of base films, for example, a thermal oxide film and a SiN film as a nitride film, are formed as shown in FIG. 2, are mounted on the wafer boat 5. The wafer boat 5 is placed on the table 8 via the heat insulating tube 7. By raising the arm 13 with the elevating mechanism, the wafer boat 5 is loaded into the process container 1 from the lower opening thereof.

Then, after the internal pressure of the process container 1 is adjusted to a pressure of 0.1 to 100 Torr (13.3 to 13,330 Pa), the opening/closing valve 28a is opened to supply a purge gas, for example, a $N_2$ gas, at a predetermined flow rate. In this state, the interior of the process container 1 is heated in advance by the heating device 42 so that the temperature of the central portion (the central portion in the vertical direction) of the wafer boat 5 becomes, for example, a predetermined temperature which falls within a range of 400 to 700 degrees C.

Thereafter, while supplying the purge gas, the opening/closing valve 24a is opened to supply a chlorine-containing gas, for example, a $Cl_2$ gas, into the process container 1 to perform a pretreatment (step S1 in FIG. 5). After a lapse of a predetermined time, the opening/closing valve 24a is closed and the interior of the process container 1 is purged for a predetermined time by the purge gas which is kept in a flowing state. Thereafter, a SiN film is continuously formed by the thermal ALD method. Specifically, the opening/closing valve 21a is opened to supply a Si source gas, for example, a DCS gas, into the process container 1, thereby allowing the DCS gas to be adsorbed onto the wafer W (step S2 in FIG. 5). After a lapse of a predetermined time, the opening/closing valve 21a is closed and the interior of the process container 1 is purged by the purge gas which is kept in a flowing state. After a lapse of a predetermined time, the opening/closing valve 18a is opened to supply a nitriding gas, for example, a $NH_3$ gas, into the process container 1, thereby performing a nitriding process (step S3 in FIG. 5). After a lapse of a predetermined time, the opening/closing valve 18a is closed and the interior of the process container 1 is purged by the purge gas which is kept in a flowing state. The supply of the DCS gas and the supply of the nitriding gas are repeated a predetermined number of times. As a result, the SiN film is thickly formed on one of the base films, for example, the SiN film, and the SiN film is thinly formed on the other base film, for example, the thermal oxide film. As a result, a selective formation of the SiN film is realized.

After completion of the formation of the SiN film, the interior of the process container 1 is purged by the purge gas while exhausting the interior of the process container 1 through the exhaust pipe 40 by the exhaust mechanism 41. Then, after returning the internal pressure of the process container 1 to atmospheric pressure, the arm 13 of the elevating mechanism is lowered to unload the wafer boat 5.

In the apparatus of this example, after the pretreatment with the chlorine-containing gas, the Si raw material gas and the $NH_3$ gas may be simultaneously supplied into the process container 1 to form a SiN film by the CVD method.

Examples of the gas supply conditions in the film forming apparatus 100 are as follows.
Flow rate of $Cl_2$ gas: 50 to 5,000 sccm
Flow rate of DCS gas: 500 to 2,000 sccm
Flow rate of $NH_3$ gas: 1,000 to 10,000 sccm
Flow rate of $N_2$ gas (purge gas): 50 to 5,000 sccm
DCS gas supply time per cycle: 3 to 60 sec
$NH_3$ gas supply time per cycle: 5 to 60 sec
Purge time per cycle: 1 to 30 sec Second Example of Film Forming Apparatus In this example, a horizontal batch-type film forming apparatus is shown as an example of the film forming apparatus.

Figure 11:
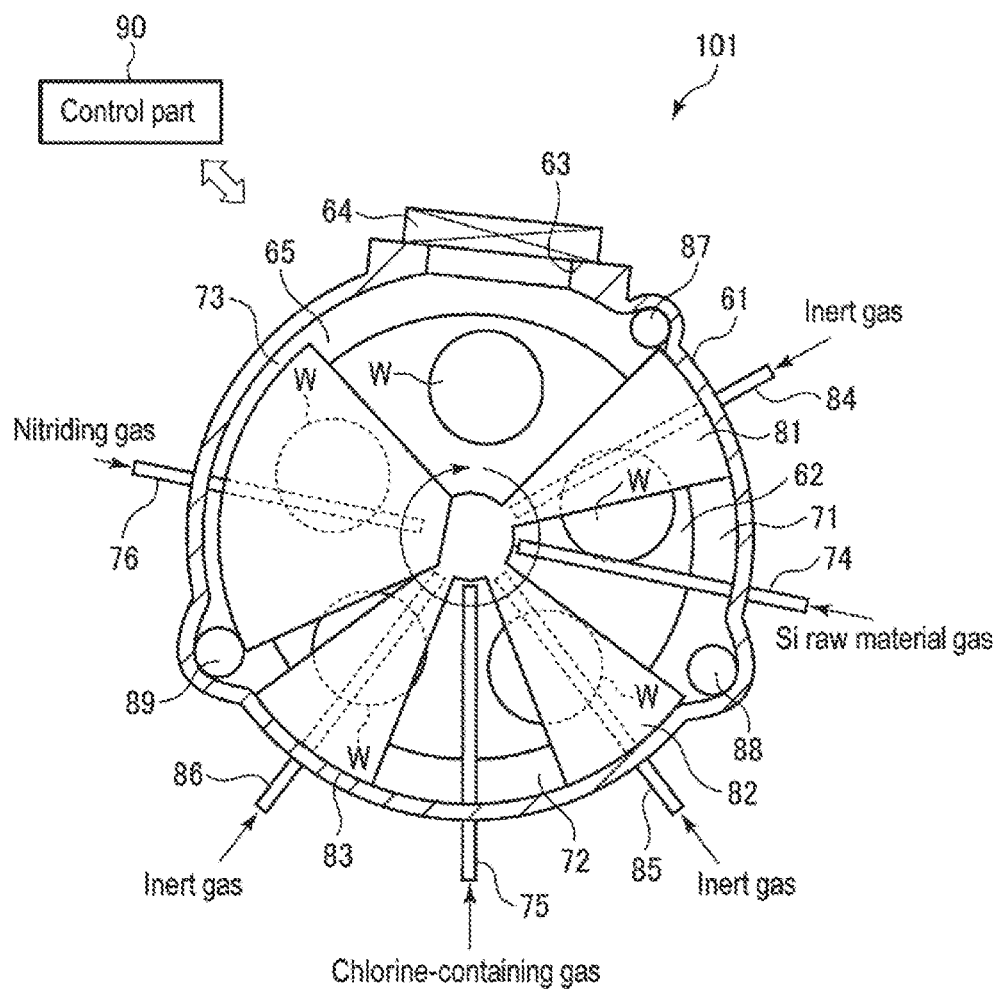
FIG. 11 is a sectional view showing a second example of the film forming apparatus for carrying out the nitride film forming method of the present disclosure.

FIG. 11 is a horizontal sectional view schematically showing a second example of the film forming apparatus for carrying out the nitride film forming method according to the present disclosure.

The film forming apparatus 101 of this example includes a metal-made process container 61 having a cylindrical shape and is configured as a cold wall type film forming apparatus. A turntable 62 on which a plurality of wafers W, for example, five wafers W, are mounted, is installed in the process container 61. The turntable 62 is rotated, for example, clockwise.

A loading/unloading gate 63 through which the wafer W is loaded into and unloaded from an adjacent transfer chamber (not shown) is formed in the peripheral wall of the process container 61. The loading/unloading gate 63 is opened and closed by a gate valve 64. A region corresponding to the loading/unloading gate 63 in the process container 61 is defined as a loading/unloading region 65. In the loading/unloading region 65, the loading of the wafer W onto the turntable 62 and the unloading of the wafer W from the turntable 62 are performed.

The interior of the process container 61 except for the loading/unloading region 65 is divided into six areas along the rotation region of the turntable 62. That is to say, the interior of the process container 61 is divided into a first process area 71, a second process area 72 and a third process area 73, which are defined clockwise from the side of the loading/unloading region 65. The interior of the process container 61 is further divided into a first separation area 81 defined between the loading/unloading region 65 and the first process area 71, a second separation area 82 defined between the first process area 71 and the second process area 72, and a third separation area 83 defined between the second process area 72 and the third process area 73. As the turntable 62 rotates, the wafer W sequentially passes through these six areas. The first to third separation areas 81 to 83 have a function of separating gas atmospheres of the first to third process areas 71 to 73 from each other.

In the first process area 71, the second process area 72 and the third process area 73, a first process gas nozzle 74, a second process gas nozzle 75 and a third process gas nozzle 76 for discharging process gases toward the wafer W mounted on the turntable 62 are installed radially along the radial direction of the process container 61.

In the first separation area 81, the second separation area 82 and the third separation area 83, a first inert gas nozzle 84, a second inert gas nozzle 85 and a third inert gas nozzle 86 for discharging an inert gas, for example, a $N_2$ gas, toward the wafer W mounted on the turntable 62 are installed radially along the radial direction of the process container 61. As the inert gas is discharged from these nozzles, the process gas atmospheres are separated from each other.

Three exhaust ports 87, 88 and 89 are formed in the bottom of the process container 61. The interior of the process container 61 is exhausted through these exhaust ports 87, 88 and 89.

In the film forming apparatus 101, a Si source gas, for example, a DCS gas, is supplied from the first process gas nozzle 74. A chlorine-containing gas, for example, a $Cl_2$ gas, is supplied from the second process gas nozzle 75. A nitriding gas, for example, a $NH_3$ gas, is supplied from the third process gas nozzle 76. Accordingly, the first process area 71 is a Si raw material gas supply area, the second process area 72 is a chlorine-containing gas supply area, and the third process area 73 is a nitriding gas supply area.

The film forming apparatus 101 includes a control part 90. The control part 90 has the same configuration as the control part 50 of the film forming apparatus 100 of the first example.

In FIG. 11, details of the Si raw material gas supply mechanism, the chlorine-containing gas supply mechanism, the nitriding gas supply mechanism and the inert gas supply mechanism are omitted because they are configured similarly to those of the film forming apparatus 100. A heating device (not shown) is installed in the turntable 62. An exhaust pipe (not shown) connected to the exhaust ports 87, 88 and 89. An exhaust mechanism (not shown) including a pressure regulation valve and a vacuum pump is installed in the exhaust pipe.

In the film forming apparatus 101 configured as above, the method of forming the SiN film of the above embodiment is realized under the control of the control part 90.

First, by opening the gate valve 64, a plurality of wafers W, for example, five wafers W, on which two types of base films, for example, a thermal oxide film and a SiN film as a nitride film, are formed, are sequentially loaded into the process container 61 by a transfer device shown) from an adjacent transfer chamber (not shown) via the loading/unloading gate 63 and are mounted on the turntable 62. Then, the internal pressure of the process container 61 is regulated to 0.1 to 5 Torr (13.3 to 667 Pa) by the exhaust mechanism. At this time, the turntable 62 is heated in advance so that the wafers W are heated to a predetermined temperature of 400 to 700 degrees C.

Next, in a state in which an inert gas, for example, a $N_2$ gas, is discharged from the first to third inert gas nozzles 84 to 86, the turntable 62 is rotated and a chlorine-containing gas, for example, a $Cl_2$ gas, is discharged from the second process gas nozzle 75. The turntable 62 is rotated a predetermined number of times and the pretreatment with the chlorine-containing gas is performed (step S1 in FIG. 5).

Thereafter, the supply of the chlorine-containing gas, for example, a $Cl_2$ gas, is stopped. At this time, the $Cl_2$ gas is removed from the wafer by the inert gas supplied from the third inert gas nozzle 86.

Thereafter, while rotating the turntable 62, a Si source gas, for example, a DCS gas, is discharged from the first process gas nozzle 74, and a nitriding gas, for example, a $NH_3$ gas, is discharged from the third process gas nozzle 76.

At this time, the wafer W sequentially passes through the first process area 71, the second separation area 82, the second process area 72, the third separation area 83, the third process area 73, and the first separation area 81. First, in the first process area 71, the DCS gas is adsorbed onto the wafer W (step S2 in FIG. 5). Then, in the second separation area 82, the excess DCS gas on the wafer W is removed by the $N_2$ gas. Then, in the third process area 73, a nitriding process is performed on the wafer W by the $NH_3$ gas (step S3 in FIG. 5). Then, in the first separation area 81, the excess $NH_3$ gas on the wafer W is removed by the $N_2$ gas. One cycle of the ALD method is performed by one turn of the turntable 62. The turntable 62 is rotated a predetermined number of times. As a result, the SiN film is thickly formed on one of the base films, for example, the SiN film, and the SiN film is thinly formed on the other base film, for example, the thermal oxide film. As a result, a selective formation of the SiN film is realized.

After the formation of the SiN film is completed, while exhausting the interior of the process container 61 by the exhaust mechanism, the inert gas is supplied from the first to third inert gas nozzles 84 to 86 to purge the interior of the process container 61. Then, the internal pressure of the process container 61 is adjusted to a pressure of the transfer chamber. The gate valve 64 is opened and the wafers W are sequentially unloaded by the transfer device via the loading/unloading gate 63.

In the apparatus of this example, the SiN film is formed exclusively by the ALD method and is not formed by the CVD method.

Examples of gas supply conditions in the film forming apparatus 101 are as follows.
Flow rate of $Cl_2$ gas: 50 to 5,000 sccm
Flow rate of DCS gas: 500 to 2,000 sccm
Flow rate of $NH_3$ gas: 1,000 to 10,000 sccm
Flow rate of $N_2$ gas (inert gas): 50 to 10,000 sccm Third Example of Film Forming Apparatus In this example, a single wafer type film forming apparatus is shown as an example of the film forming apparatus.

Figure 12:
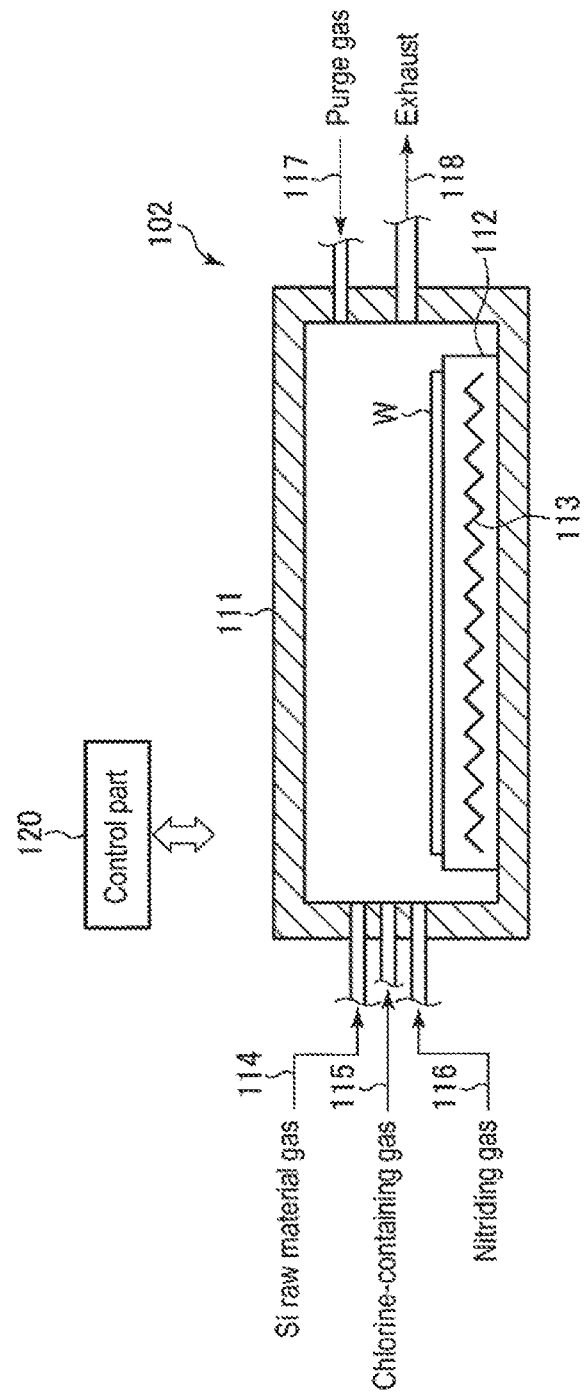
FIG. 12 is a sectional view showing a third example of the film forming apparatus for carrying out the nitride film forming method of the present disclosure.

FIG. 12 is a horizontal sectional view schematically showing a third example of the film forming apparatus for carrying out the nitride film forming method according to the present disclosure.

The film forming apparatus 102 of this example includes a metal-made process container 111 having a cylindrical shape and is configured as a cold wall type film forming apparatus. A substrate mounting table 112 is installed in the bottom of the process container 111. A wafer W as a substrate to be processed is mounted on the substrate mounting table 112. A heater 113 is installed in the substrate mounting table 112.

A Si raw material gas pipe 114 configured to introduce a Si raw material gas, for example, a DCS gas, into the process container 111, a chlorine-containing gas pipe 115 configured to introduce a chlorine-containing gas, for example, a $Cl_2$ gas, into the process container 111, and a nitriding gas pipe 116 configured to introduce a nitriding gas, for example, a $NH_3$ gas, into the process container 111 are adjacently connected to a predetermined portion of the side surface of the process container 111.

A purge gas pipe 117 configured to supply an inert gas as a purge gas, for example, a $N_2$ gas, and an exhaust pipe 118 configured to exhaust the interior of the process container 111 are connected to a portion of the side surface of the process container 111 opposite to the portion to which the Si raw material gas pipe 114 and the like are connected.

The film forming apparatus 102 includes a control part 120. The control part 120 has the same configuration as the control part 50 of the film forming apparatus 100 of the first example.

In FIG. 12, details of the Si raw material gas supply mechanism, the chlorine-containing gas supply mechanism, the nitriding gas supply mechanism and the inert gas supply mechanism are omitted because they are configured similarly to those of the film forming apparatus 100. An exhaust mechanism (not shown) including a pressure regulation valve and a vacuum pump is installed in the exhaust pipe.

In the film forming apparatus 102 configured as above, the method of forming the SiN film of the above embodiment is realized under the control of the control part 120.

First, by opening a gate valve, a single wafer W, on which two types of base films, for example, a thermal oxide film and a SiN film as a nitride film, are formed as shown in FIG. 2, is loaded into the process container 111 by a transfer device (not shown) from an adjacent transfer chamber (not shown) via a loading/unloading gate (not shown) and is mounted on the substrate mounting table 112. Then, the internal pressure of the process container 111 is regulated to 0.1 to 5 Torr (13.3 to 667 Pa) by the exhaust mechanism. At this time, the substrate mounting table 112 is heated in advance by the heater 113 so that the wafer W is heated to a predetermined temperature of 400 to 700 degrees C.

Thereafter, while supplying a purge gas, for example, a $N_2$ gas, a chlorine-containing gas, for example, a $Cl_2$ gas, is supplied into the process container 1 to perform a pretreatment (step S1 in FIG. 5). After a lapse of a predetermined time, the supply of the $Cl_2$ gas is stopped and the interior of the process container 111 is purged for a predetermined time by the purge gas which is kept in a flowing state. Thereafter, a SiN film is continuously formed by the thermal ALD method. Specifically, a Si source gas, for example, a DCS gas, is supplied into the process container 111, thereby allowing the DCS gas to be adsorbed onto the wafer W (step S2 in FIG. 5) After a lapse of a predetermined time, the supply of the DCS gas is stopped and the interior of the process container 111 is purged by the purge gas which is kept in a flowing state. After a lapse of a predetermined time, a nitriding gas, for example, a $NH_3$ gas, is supplied into the process container 111 to perform a nitriding process (step S3 in FIG. 5). After a lapse of a predetermined time, the supply of the $NH_3$ gas is stopped and the interior of the process container 111 is purged by the purge gas which is kept in a flowing state. The supply of the DCS gas and the supply of the nitriding gas are repeated a predetermined number of times. As a result, the SiN film is thickly formed on one of the base films, for example, the SiN film, and the SiN film is thinly formed on the other base film, for example, the thermal oxide film. As a result, a selective formation of the SiN film is realized.

After the formation of the SiN film is completed, the interior of the process container 111 is purged by the purge gas while exhausting the interior of the process container 111 through the exhaust pipe 118 by the exhaust mechanism. Then, the internal pressure of the process container 111 is adjusted to a pressure of the transfer chamber. The gate valve is opened and the wafer W is unloaded via the loading/unloading gate.

In the apparatus of this example, after the pretreatment with the chlorine-containing gas, the Si raw material gas and the $NH_3$ gas may be simultaneously supplied into the process container 1 to form a SiN film by the CVD method.

Examples of the gas supply conditions in the film forming apparatus 102 are as follows.
Flow rate of $Cl_2$ gas: 50 to 5,000 sccm
Flow rate of DCS gas: 10 to 2,000 sccm
Flow rate of $NH_3$ gas: 1,000 to 5,000 sccm
Flow rate of $N_2$ gas (purge gas): 50 to 5,000 sccm
DCS gas supply time per cycle: 0.1 to 60 sec
$NH_3$ gas supply time per cycle: 0.1 to 60 sec
Purge time per cycle: 0.1 to 60 sec Other Applications While the embodiment of the present disclosure has been described above, the present disclosure is not limited to the above embodiment. Various modifications can be made without departing from the spirit of the present disclosure.

For example, in the above embodiment, there has been described the case where the silicon nitride film is formed using the Si raw material gas and the nitriding gas. However, the present disclosure is not limited thereto. The present disclosure may be applied to a case where other nitride films are formed using a raw material gas and a nitriding gas. For example, the present disclosure may be applied to formation of various nitride films, such as a case where a TiN film is formed using a Ti raw material, a case where a BN film is formed using a B raw material, a case where a WN film is formed using a W raw material, or the like.

In the above-described embodiment, there has been illustrated an example in which the substrate to be processed having the $SiO_2$ film and the SiN film as base films is used. However, the present disclosure may be applied to any substrate to be processed as long as it has two or more kinds of base films differing in the adsorptivity of a chlorine-containing gas. For example, one base film may be an oxide film other than the $SiO_2$ film, and the other base film may be a nitride film other than the SiN film. In addition, it may be possible to use a combination other than the combination of an oxide film and a nitride film.

While the vertical batch-type film forming apparatus, the horizontal batch-type film forming apparatus and the single wafer type film forming apparatus have been illustrated as typical examples of the film forming apparatus, the film forming apparatus is not limited to the illustrated ones. Other film forming apparatuses may be used as long as they can realize the nitride film forming method according to the present disclosure.

In the above embodiment, the semiconductor wafer has been taken as an example of a substrate to be processed. However, the present disclosure is not limited thereto but may be applied to other substrates such as a glass substrate of a flat panel display, a ceramic substrate or the like.

In the present disclosure, a substrate to be processed having a first base film and a second base film formed thereon is subjected to a pretreatment with a chlorine-containing gas, and subsequently, a nitride film is formed on the substrate to be processed by the ALD method or the CVD method using a raw material gas and a nitriding gas. Thus, it is possible to selectively form the nitride film on one of the first base film and the second base film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride film forming method, comprising:
   performing a pretreatment of adsorbing a chlorine-containing gas onto a surface of a first base film and a surface of a second base film, the first base film and the second base film being formed on a substrate to be processed, by supplying the chlorine-containing gas while heating the substrate to be processed to a predetermined temperature; and
   forming a nitride film on the first base film and the second base film subjected to the pretreatment, by an ALD method or a CVD method, using a raw material gas and a nitriding gas, while heating the substrate to be processed to a predetermined temperature,
   wherein the chlorine-containing gas used in the step of performing the pretreatment is at least one gas selected from a group consisting of a $Cl_2$ gas, a HCl gas and a $BCl_3$ gas.

2. The method of claim 1, wherein in a case where the step of forming the nitride film is performed by the ALD method, the raw material gas is supplied at first.

3. The method of claim 1, wherein the first base film is relatively high in adsorptivity of the chlorine-containing gas and the second base film is relatively low in adsorptivity of the chlorine-containing gas.

4. The method of claim 3, wherein the first base film is a silicon oxide film, the second base film is a silicon nitride film, and the nitride film formed on the first base film and the second base film is a silicon nitride film.

5. The method of claim 4, wherein a raw material gas used for forming the silicon nitride film is any one of dichlorosilane, monochlorosilane, trichlorosilane, silicon tetrachloride, hexachlorodisilane, monosilane, disilane and an organic silane-based compound.

6. The method of claim 4, wherein the step of forming the nitride film is performed at 400 to 700 degrees C. in the case of the ALD method and at 600 to 800 degrees C. in the case of the CVD method.

7. The method of claim 1, wherein the step of performing the pretreatment is performed at 200 to 800 degrees C.

8. The method of claim 1, wherein the step of performing the pretreatment and the step of forming the nitride film are continuously performed in the same apparatus.

9. The method of claim 8, wherein the step of performing the pretreatment and the step of forming the nitride film are performed at the same temperature.

10. The method of claim 1, wherein the nitriding gas used in the step of forming the nitride film is an ammonia gas, a hydrazine gas, or a hydrazine derivative gas.

11. A non-transitory computer-readable storage medium storing a program operated on a computer and configured to control a processing apparatus,
    wherein the program is configured to, when executed, cause the computer to control the processing apparatus so that the method of claim 1 is performed.

* * * * *